United States Patent
Katou et al.

(10) Patent No.: US 10,971,621 B2
(45) Date of Patent: Apr. 6, 2021

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Hiroaki Katou, Nonoichi Ishikawa (JP); Tatsuya Nishiwaki, Nonoichi Ishikawa (JP); Kohei Oasa, Nonoichi Ishikawa (JP); Toshifumi Nishiguchi, Hakusan Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/542,784

(22) Filed: Aug. 16, 2019

(65) Prior Publication Data

US 2020/0266293 A1    Aug. 20, 2020

(30) Foreign Application Priority Data

Feb. 19, 2019    (JP) .............................. JP2019-027471

(51) Int. Cl.
*H01L 29/78* (2006.01)
*H01L 29/40* (2006.01)

(52) U.S. Cl.
CPC ........ *H01L 29/7813* (2013.01); *H01L 29/407* (2013.01)

(58) Field of Classification Search
CPC .......................... H01L 29/7813; H01L 29/407
See application file for complete search history.

(56) References Cited

U.S. PATENT DOCUMENTS

| 9,048,214 B2* | 6/2015 | Padmanabhan ..... H01L 29/7813 |
| 9,543,429 B2 | 1/2017 | Hiyoshi et al. |
| 2014/0167145 A1 | 6/2014 | Ichinoseki |

FOREIGN PATENT DOCUMENTS

| JP | 5366297 B2 | 12/2013 |
| JP | 2014-120656 A | 6/2014 |
| JP | 6135436 B2 | 5/2017 |

\* cited by examiner

*Primary Examiner* — Marc Anthony Armand
(74) *Attorney, Agent, or Firm* — White & Case LLP

(57) ABSTRACT

A semiconductor device includes a semiconductor body, first and second electrodes, and first and second control electrodes. The first and second electrodes are provided on the semiconductor body. The first and second control electrodes each include a first portion positioned between the semiconductor body and the first electrode, a second portion positioned between the semiconductor body and the second electrode, and a third portion linked to the first and second portions. The semiconductor body includes first to fourth semiconductor layers. The second semiconductor layer is provided on the first semiconductor layer, and extends along the first to third portions. The fourth semiconductor layer is provided selectively on the second semiconductor layer, and extends along the second and third portions. The fourth semiconductor layer includes second conductivity-type impurities with a higher concentration than a concentration of second conductivity-type impurities in the second semiconductor layer.

14 Claims, 5 Drawing Sheets

SEMICONDUCTOR DEVICE

CROSS-REFERENCE TO RELATED APPLICATIONS

This application is based upon and claims the benefit of priority from Japanese Patent Application No. 2019-027471, filed on Feb. 19, 2019; the entire contents of which are incorporated herein by reference.

FIELD

Embodiments relate to a semiconductor device.

BACKGROUND

In a trench-gate MOSFET (Metal Oxide Semiconductor Field Effect Transistor), for example, dielectric breakdown may occur by a high voltage applied to the gate insulating film in the terminal region due to the variation of source-drain voltage. When the gate insulating film in the terminal region is made thicker to prevent the dielectric breakdown, the semiconductor region positioned between adjacent gate electrodes may have a narrower width. Thus, it is difficult for the source electrode to contact the semiconductor region.

DETAILED DESCRIPTION

Figure 1:
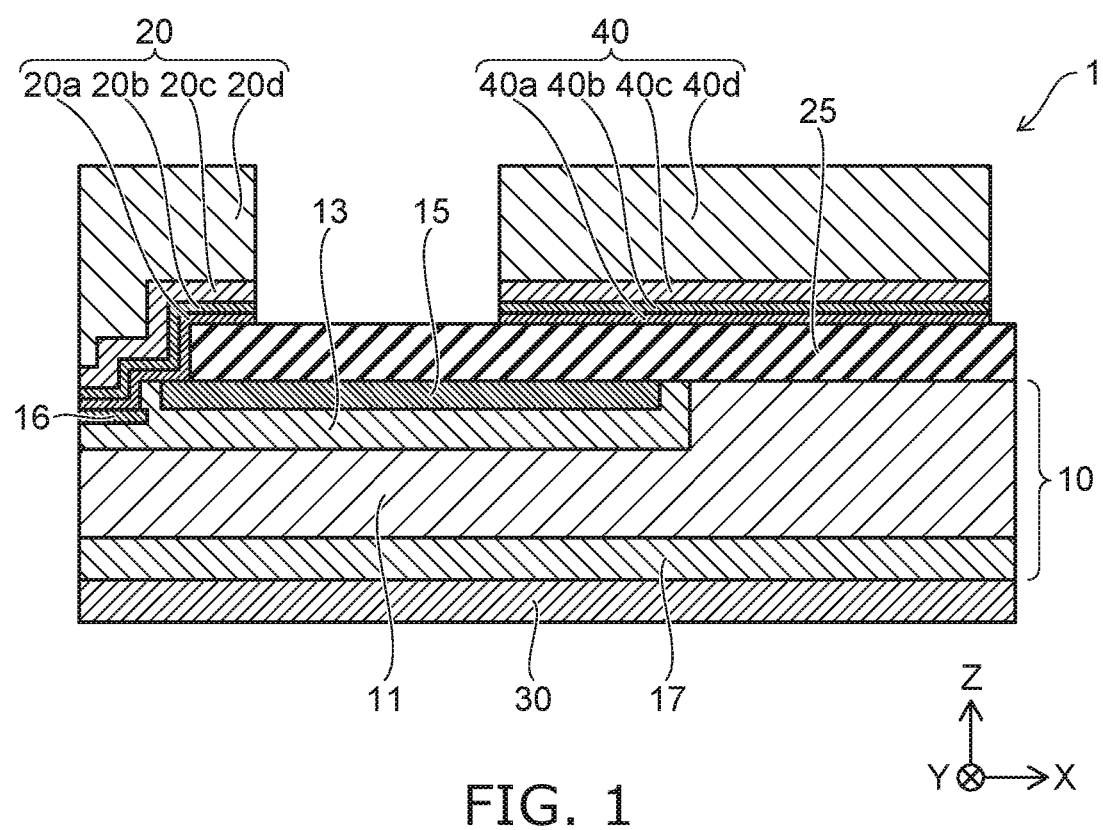
FIG. 1 is a schematic cross-sectional view showing a semiconductor device according to an embodiment.

According to one embodiment, a semiconductor device includes a semiconductor body, first and second electrodes, and first and second control electrodes. The first electrode is provided on a front surface of the semiconductor body. The first control electrode is placed inside a first trench, the first trench being provided on the front surface side of the semiconductor body. The first control electrode is electrically insulated from the semiconductor body by a first insulating film. The second control electrode is placed inside a second trench adjacent to the first trench on the front surface side of the semiconductor body. The second control electrode is electrically insulated from the semiconductor body by a second insulating film. The second electrode is provided on the front surface of the semiconductor body with a third insulating film interposed. The second electrode is electrically connected to the first control electrode and the second control electrode. The second electrode is placed to be spaced from the first electrode. The first and second control electrodes each include a first portion, a second portion, and a third portion. The first portion is positioned between the semiconductor body and the first electrode. The second portion is positioned between the semiconductor body and the second electrode. The third portion is linked to the first portion and the second portion. The semiconductor body includes a first semiconductor layer of a first conductivity type, a second semiconductor layer of a second conductivity type, a third semiconductor layer of the first conductivity type, and a fourth semiconductor layer of the second conductivity type. The second to fourth semiconductor layers being provided between the first control electrode and the second control electrode. The second semiconductor layer is provided on the first semiconductor layer and extending along the first portions, the third portions and the second portions of the first control electrode and the second control electrode. The third semiconductor layer is selectively provided between the second semiconductor layer and the first electrode. The fourth semiconductor layer is provided selectively on the second semiconductor layer. The fourth semiconductor layer extends along the third portions and the second portions of the first control electrode and the second control electrode along an extension direction of the first control electrode and the second control electrode. The fourth semiconductor layer includes second conductivity-type impurities with a higher concentration than a concentration of second conductivity-type impurities in the second semiconductor layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 2:
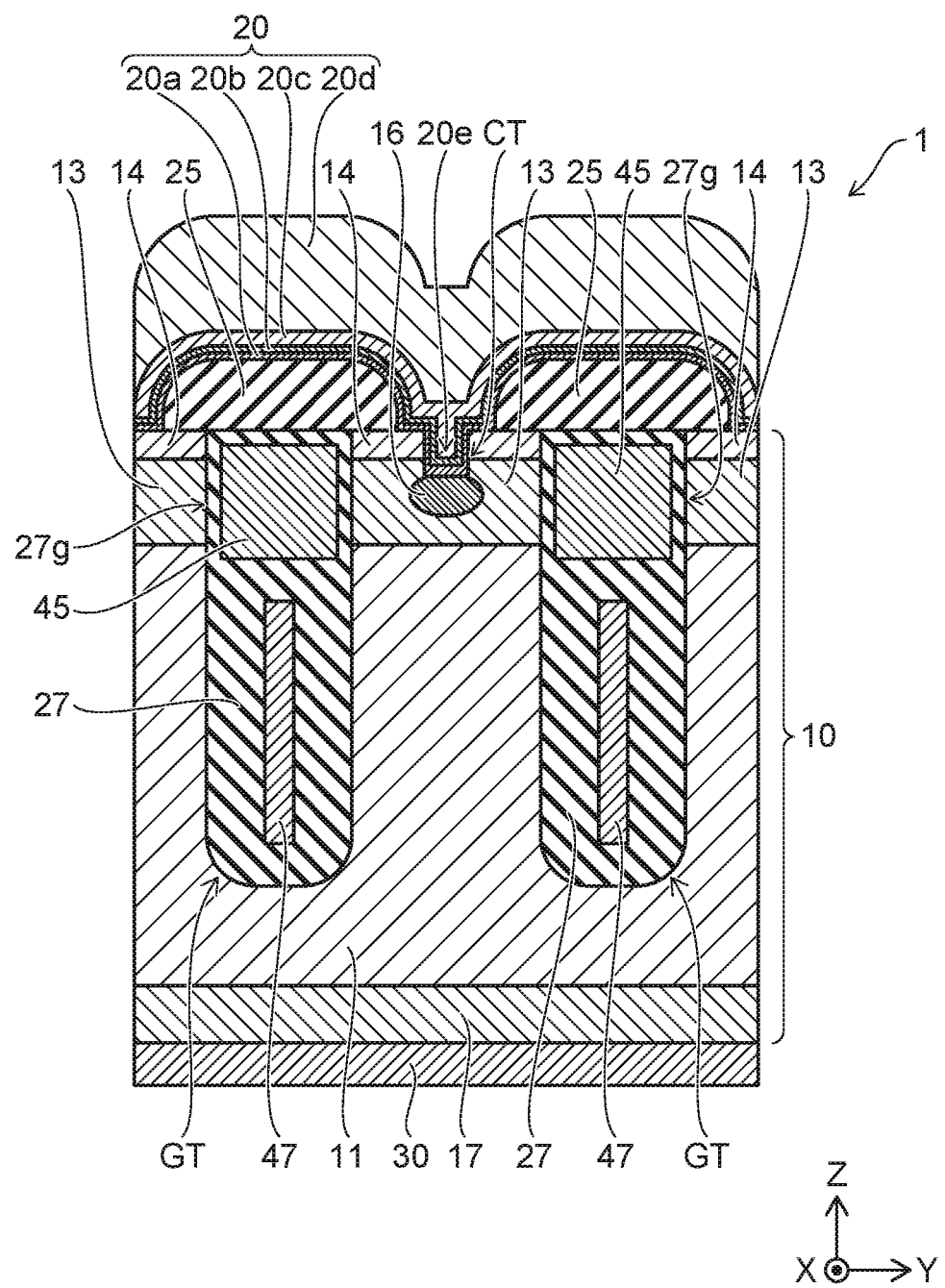
FIG. 2 is another schematic cross-sectional view showing the semiconductor device according to the embodiment.

FIG. 1 and FIG. 2 are schematic cross-sectional views showing a semiconductor device 1 according to an embodiment. The semiconductor device 1 is a MOSFET having a trench gate structure. FIG. 1 is a schematic view showing the cross-sectional structure of the terminal region of the semiconductor device 1. FIG. 2 is a schematic view showing the cross-sectional structure of the active region of the semiconductor device 1.

As shown in FIG. 1, the semiconductor device 1 includes a semiconductor body 10, a first electrode (hereinbelow, the source electrode) 20, a drain electrode 30, and a second electrode (hereinbelow, the gate pad) 40. The source electrode 20 and the gate pad 40 are provided at the front surface side of the semiconductor body 10; and the drain electrode 30 is provided on the back surface of the semiconductor body 10. The gate pad 40 is positioned in the terminal region and is provided to be separated from the source electrode 20 in a direction along the front surface of the semiconductor body 10. The gate pad 40 is electrically insulated from the semiconductor body 10 by an insulating film 25. The insulating film 25 is provided to cover the front surface of the semiconductor body 10 in the terminal region. The insulating film 25 includes a portion positioned between the semiconductor body 10 and the end of the source electrode 20 and a portion positioned between the gate pad 40 and the semiconductor body 10.

The semiconductor body 10 is, for example, silicon and includes first to fourth semiconductor layers. The first semiconductor layer is, for example, an n-type drift layer 11. The second semiconductor layer is, for example, a p-type base layer 13. The third semiconductor layer is, for example, an n-type source layer 14 (referring to FIG. 2). The fourth semiconductor layer is a p-type high-concentration layer 15, for example.

The n-type drift layer 11 is provided in the entire active region and terminal region. The p-type base layer 13 is provided on the n-type drift layer 11 and extends from the active region into the terminal region. The p-type high-concentration layer 15 is provided selectively on the p-type base layer 13 in the terminal region. Here, the active region is defined as where the n-type source layer 14 is provided (referring to FIG. 3A); and the terminal region extends in the X-direction outward from the active region.

For example, the p-type high-concentration layer 15 extends in the X-direction and includes p-type impurities with a higher concentration than the concentration of p-type impurities in the p-type base layer 13. The p-type high-concentration layer 15 includes a portion positioned between the p-type base layer 13 and the gate pad 40. The p-type high-concentration layer 15 also may include a portion positioned between the p-type base layer 13 and the end of the source electrode 20. The insulating film 25 includes a portion positioned between the p-type high-concentration layer 15 and the end of the source electrode 20. Moreover, the p-type high-concentration layer 15 may be provided to contact the source electrode 20.

For example, the source electrode 20 has a multilayer structure including a contact layer 20a, a barrier layer 20b, a buried layer 20c, and a bonding layer 20d. The contact layer 20a is, for example, a titanium layer which contacts the n-type source layer 14 and a p-type contact layer 16 (referring to FIG. 2). For example, the contact layer 20a has a thickness of 10 to 30 nanometers (nm). The barrier layer 20b is, for example, a titanium nitride layer which has a thickness of 10 to 50 nm. The buried layer 20c is, for example, a tungsten layer which has a thickness of 100 to 300 nm. The bonding layer 20d is, for example, an aluminum layer which has a thickness of, for example, 4 micrometers ($\mu$m).

For example, the gate pad 40 also has a multilayer structure including a contact layer 40a, a barrier layer 40b, a buried layer 40c, and a bonding layer 40d. The contact layer 40a is, for example, a titanium layer which contacts a gate electrode 45 (referring to FIG. 3B). The barrier layer 40b is, for example, a titanium nitride layer. The buried layer 40c is, for example, a tungsten layer. The bonding layer 40d is, for example, an aluminum layer.

For example, the gate pad 40 is formed simultaneously with the source electrode 20. The contact layer 40a has a thickness of, for example, 10 to 30 nm; and the barrier layer 40b has a thickness of, for example, 10 to 50 nm. The buried layer 40c has a thickness of, for example, 100 to 300 nm; and the bonding layer 40d has a thickness of, for example, 4 $\mu$m.

As shown in FIG. 2, the semiconductor device 1 further includes a control electrode (hereinbelow, the gate electrode 45) and a field plate 47 which are provided inside a gate trench GT. The gate electrode 45 is, for example, conductive polysilicon or a metal. The field plate 47 is, for example, conductive polysilicon.

The gate trench GT is provided in the front surface side of the semiconductor body 10. The gate electrode 45 and the field plate 47 are electrically insulated from the semiconductor body 10 by an insulating film 27 that is provided inside the gate trench GT. The gate electrode 45 and the field plate 47 are electrically insulated from each other by the insulating film 27. The insulating film 27 is, for example, a silicon oxide film. For example, the insulating film 27 is formed using thermal oxidation, CVD (Chemical Vapor Deposition), or both.

For example, the field plate 47 is positioned between the n-type drift layer 11 and the gate electrode 45, in the Z-direction. The gate electrode 45 is positioned between the source electrode 20 and the field plate 47. The gate electrode 45 is electrically insulated from the source electrode 20 by the insulating film 25. For example, the insulating film 25 has a thickness of 1 $\mu$m.

The p-type base layer 13 is provided between the adjacent gate electrodes 45, and is positioned between the n-type drift layer 11 and the source electrode 20. The n-type source layer 14 is selectively provided between the p-type base layer 13 and the source electrode 20. The n-type source layer 14 is electrically connected to the source electrode 20. A portion of the insulating film 27 positioned between the p-type base layer 13 and the gate electrode 45 functions as a gate insulating film 27g.

The semiconductor body 10 includes the p-type contact layer 16 and an n-type drain layer 17. For example, the p-type contact layer 16 is provided inside the p-type base layer 13 and includes p-type impurities with a higher concentration than the concentration of p-type impurities in the p-type base layer 13.

The source electrode 20 is provided to contact the p-type contact layer 16. For example, the source electrode 20 has a portion 20e that extends into a contact trench CT provided in the front surface side of the semiconductor body 10. The portion 20e of the source electrode 20 contacts the p-type contact layer 16 in the contact trench CT. The contact trench CT is provided between the adjacent gate electrodes 45 and has, for example, a depth that divides the n-type source layer 14 and reaches the p-type base layer 13. The source electrode 20 is electrically connected to the p-type contact layer 16. The source electrode 20 also is electrically connected to the p-type base layer 13 through the p-type contact layer 16.

The n-type drain layer 17 is provided between the n-type drift layer 11 and the drain electrode 30. The n-type drain layer 17 includes n-type impurities with a higher concentration than the concentration of n-type impurities in the n-type drift layer 11 and is electrically connected to the drain electrode 30.

Figure 3A:
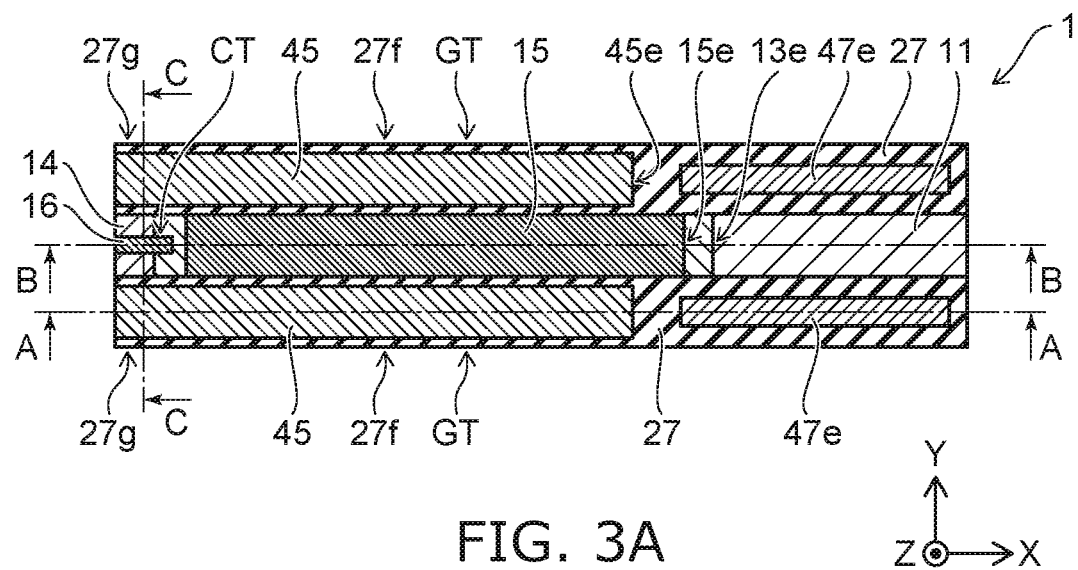
FIGS. 3A and 3B are schematic views showing the semiconductor device according to the embodiment.
Figure 3B:
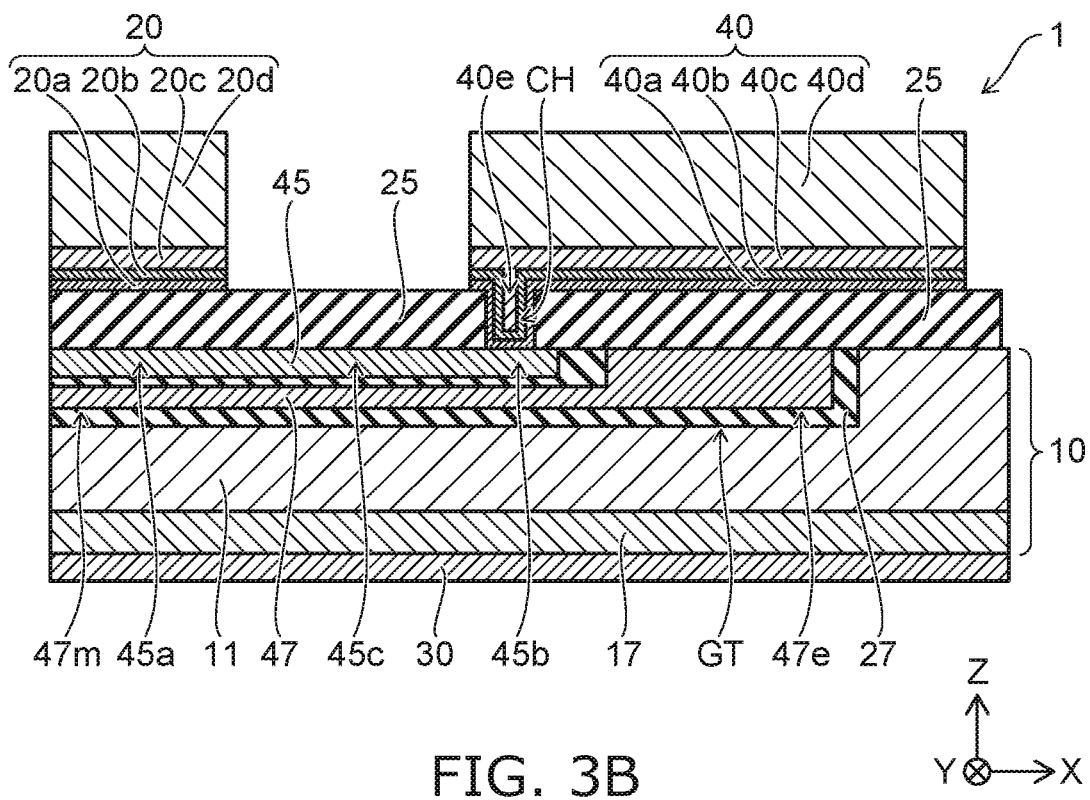

FIGS. 3A and 3B are schematic views showing the semiconductor device 1 according to the embodiment. FIG. 3A is a plan view schematically illustrating the front surface of the semiconductor body 10. FIG. 3B is a schematic view illustrating a cross-sectional structure along line A-A shown in FIG. 3A.

The source electrode 20, the gate pad 40, and the insulating film 25 are not illustrated in FIG. 3A. For example, FIG. 1 is a schematic view illustrating a cross section along line B-B shown in FIG. 3A, FIG. 2 is a schematic view illustrating a cross section along line C-C shown in FIG. 3A.

As shown in FIG. 3A, the p-type high-concentration layer 15 is provided between mutually-adjacent gate trenches GT in the terminal region and extends in the X-direction along the gate electrode 45. The p-type high-concentration layer 15 is provided to protrude further in the X-direction than an end 45e of the gate electrode 45. In other words, an end 15e of the p-type high-concentration layer 15 is positioned outward of the end 45e of the gate electrode 45 in the X-direction.

An end 13e of the p-type base layer 13 is positioned outward of the end 15e of the p-type high-concentration layer 15 in the X-direction. Thereby, electric field concentration at the end of the terminal region can be relaxed; and the breakdown voltage of the terminal region can be increased.

As shown in FIG. 3A, the field plate 47 includes an end portion 47e positioned inside the gate trench GT and outward of the gate electrode 45. The p-type base layer 13 includes, for example, a portion positioned between the end portions 47e of the field plates 47 adjacent to each other in the Y-direction. The p-type high-concentration layer 15 also may be provided to include a portion positioned between the end portions 47e of the field plates 47 adjacent to each other in the Y-direction. The p-type base layer 13 and the p-type high-concentration layer 15 are provided so that the ends 13e and 15e are not positioned outward of the field plate 47 in the X-direction.

As shown in FIG. 3B, the gate electrode 45 is provided to extend inside the gate trench GT and to be continuous in the X-direction. The gate electrode 45 includes a first portion 45a positioned between the n-type drift layer 11 and the source electrode 20, a second portion 45b positioned between the n-type drift layer 11 and the gate pad 40, and a third portion 45c linked to the first portion 45a and the second portion 45b.

The gate electrode 45 is electrically connected to the gate pad 40 and is electrically insulated from the source electrode 20 by the insulating film 25. The gate pad 40 is electrically connected to the second portion 45b of the gate electrode 45 via a portion 40e that extends inside a contact hole CH provided in the insulating film 25.

For example, the p-type high-concentration layer 15 extends in the X-direction along the first portion 45a, the third portion 45c, and the second portion 45b of the gate electrode 45 (referring to FIG. 1). The p-type high-concentration layer 15 extends in the X-direction along at least the third portion 45c and the second portion 45b (referring to FIG. 5A).

The field plate 47 includes a portion 47m positioned between the n-type drift layer 11 and the gate electrode 45, and the end portion 47e positioned outward of the gate electrode 45. For example, the field plate 47 is electrically connected to the source electrode 20 at a portion not-illustrated.

Figure 4A:
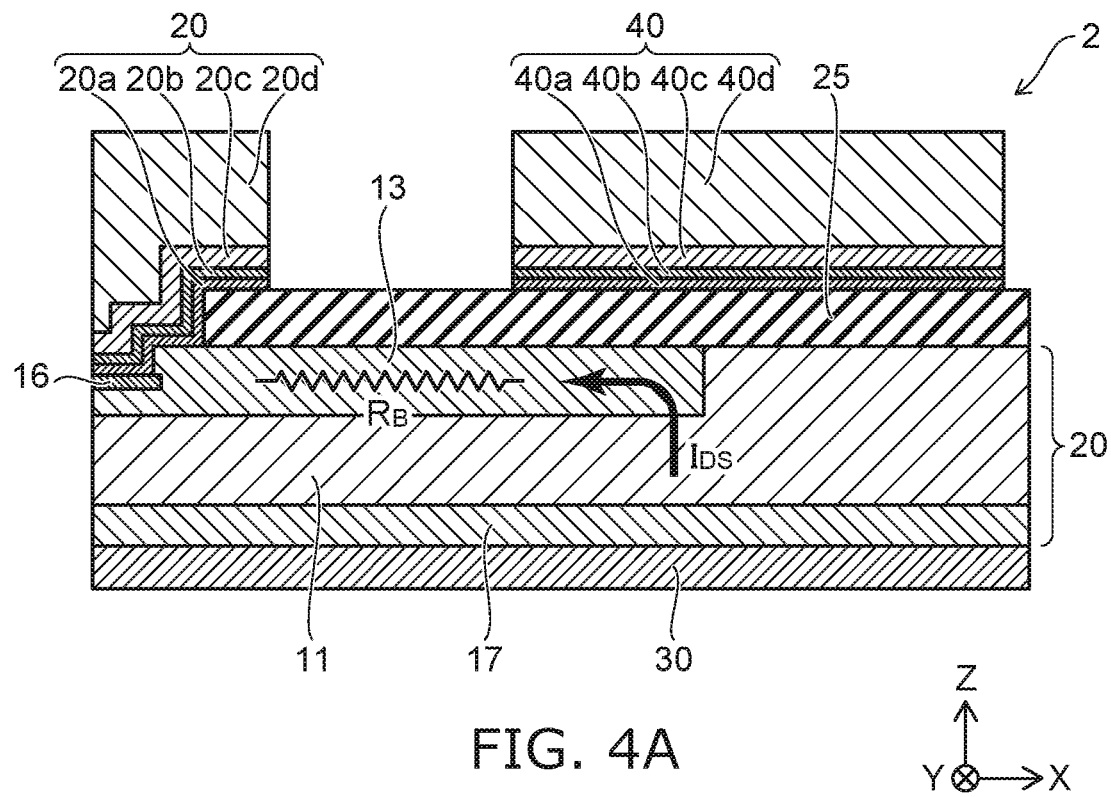
FIGS. 4A and 4B are schematic cross-sectional views showing a semiconductor device according to a comparative example.
Figure 4B:
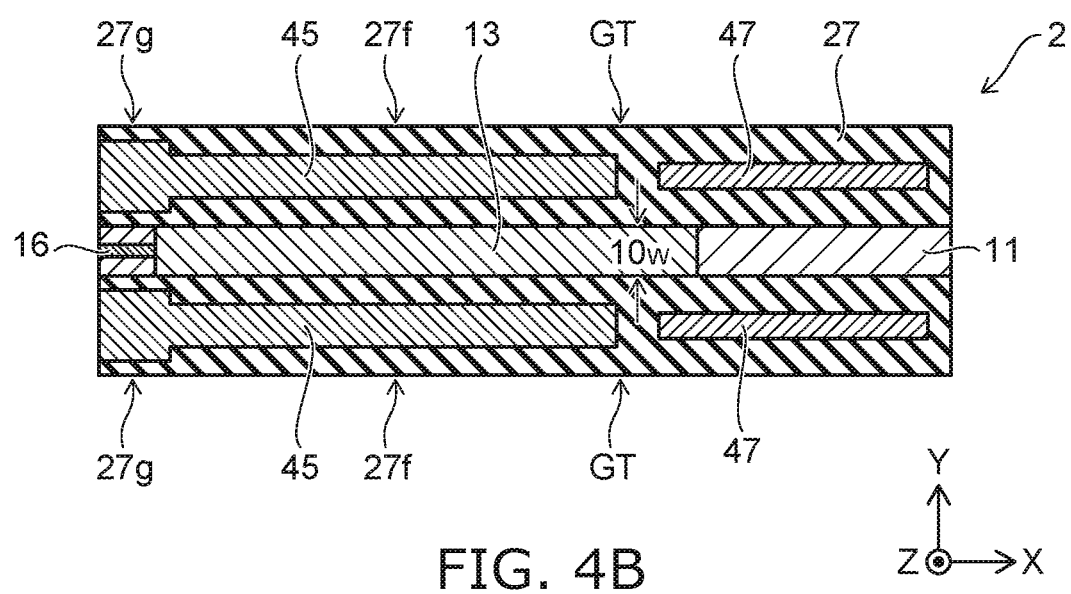

FIGS. 4A and 4B are schematic cross-sectional views showing a semiconductor device 2 according to a comparative example. FIG. 4A is a schematic view showing a cross section corresponding to the cross section shown in FIG. 1. FIG. 4B is a plan view schematically showing the front surface of the semiconductor body 10.

As shown in FIG. 4A, the p-type high-concentration layer 15 (referring to FIG. 1) is not provided in the semiconductor device 2. For example, while the semiconductor device 2 operates under the switching mode, displacement current $I_{DS}$ flows due to the variation of the source-drain voltage. A parasitic resistance $R_B$ of the p-type base layer 13 is large because the p-type high-concentration layer 15 is not provided in the terminal region of the semiconductor device 2. Accordingly, a large potential difference occurs inside the p-type base layer 13 when the displacement current $I_{DS}$ flows. Thereby, a high electric field is induced inside the gate insulating film between the gate electrode 45 and the p-type base layer 13; and dielectric breakdown may occur.

As shown in FIG. 4B, for example, the semiconductor device 2 has a structure in which a gate insulating film 27f is made thicker in the terminal region. The dielectric breakdown that is caused by the displacement current $I_{DS}$ may be avoided thereby.

However, for example, the semiconductor device 2 has a trench gate structure that is downscaled nearly to the manufacturing limit so as to reduce the ON-resistance. Therefore, it is difficult to reduce the width in the Y-direction of the gate electrode 45. Accordingly, when the gate insulating film 27f is set to be thicker, the width in the Y-direction of the gate trench GT becomes wider; and a width $10_W$ in the Y-direction of the semiconductor body 10 becomes narrower at the portion positioned between the gate electrodes 45.

On the other hand, the width in the Y-direction of the gate insulating film 27g formed in the active region is narrower than the width in the Y-direction of the gate insulating film 27f in the terminal region. For example, in a gate trench GT that is downscaled to the size of the manufacturing limit, it is difficult to change the trench width in the Y-direction corresponding to the widths of the gate insulating films 27g and 27f. Accordingly, the gate trench GT may have the same width in the Y-direction in the active region and the terminal region; and thus, the semiconductor body 10 is formed in the active region and the terminal region so as to have the same width $10_W$ in Y-direction. Therefore, when the gate insulating film 27f is set to be thicker in the terminal region, the width $10_W$ of the semiconductor body 10 in the active region becomes narrower. As a result, it is difficult for the source electrode 20 to contact the n-type source layer 14 and the p-type contact layer 16 positioned between the gate electrodes 45. When the width $10_W$ in the Y-direction of the semiconductor body 10 is increased to avoid this difficulty, making the gate-channel with higher density is obstructed; and it is difficult to reduce the ON-resistance.

In contrast, it is possible in the semiconductor device 1 to reduce the parasitic resistance $R_B$ by providing the p-type high-concentration layer 15 on the p-type base layer 13. Thereby, the potential difference inside the p-type base layer 13 can be reduced; and inducing the high electric field can be avoided in the gate insulating film 27f in the terminal region (referring to FIG. 4B). Accordingly, it is possible in the semiconductor device 1 to set the film thickness in the Y-direction of the gate insulating film 27f in the terminal region to be the same as the film thickness in the Y-direction of the gate insulating film 27g in the active region. Thereby, the width $10_W$ may be wider in the semiconductor body 10 positioned between the gate electrodes 45; and it is easy for the source electrode 20 to contact the n-type source layer 14 and the p-type contact layer 16. Here, the "film thicknesses being the same" means that the film thicknesses are "substantially the same, for example, which include differences due to inaccuracy of manufacturing process, etc., although the film thicknesses are formed to be the same.

When the downscaling of the gate trench GT is performed at a level that permits the film thickness of the gate insulating film 27f and the film thickness of the gate insulating film 27g to be different in the Y-direction, it is preferable to set the film thickness of the gate insulating film 27f to be thicker than the film thickness of the gate insulating film 27g. Thereby, in addition to providing the p-type high-concentration layer 15, it is possible to increase the insulation breakdown voltage of the gate insulating film 27f in the terminal region; and thus, the dielectric breakdown may be avoided more effectively.

Figure 5A:
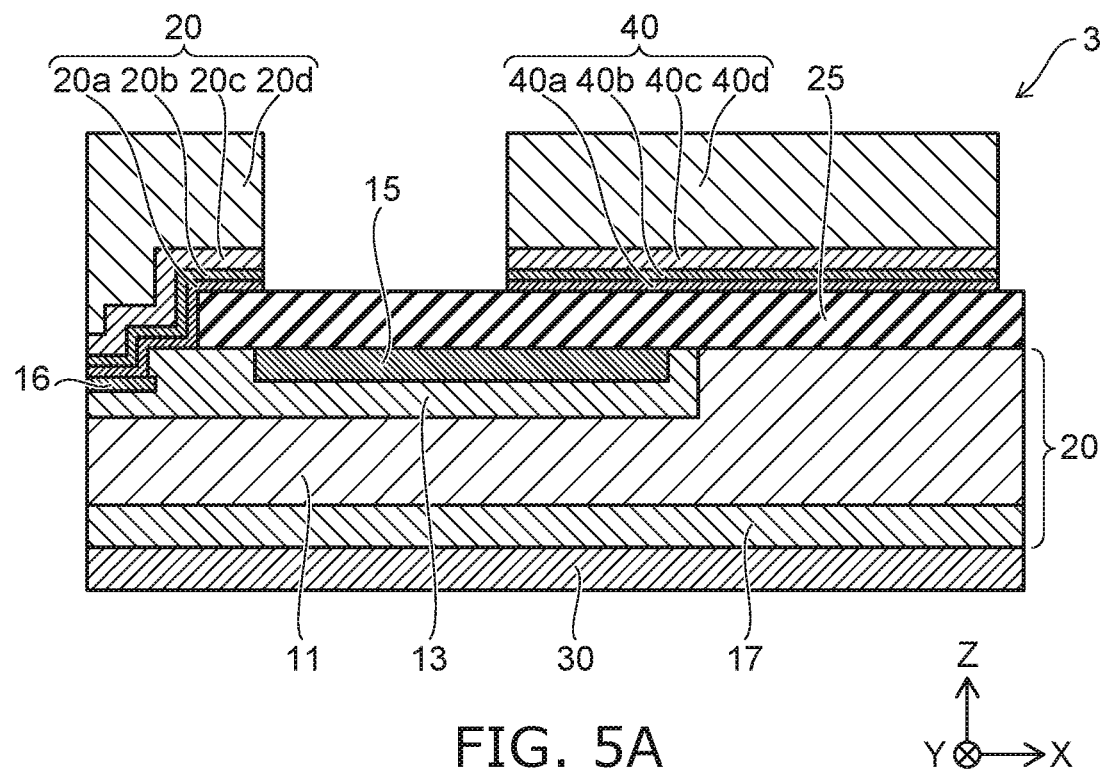
FIGS. 5A and 5B are schematic cross-sectional views showing semiconductor devices according to modifications of the embodiment.
Figure 5B:
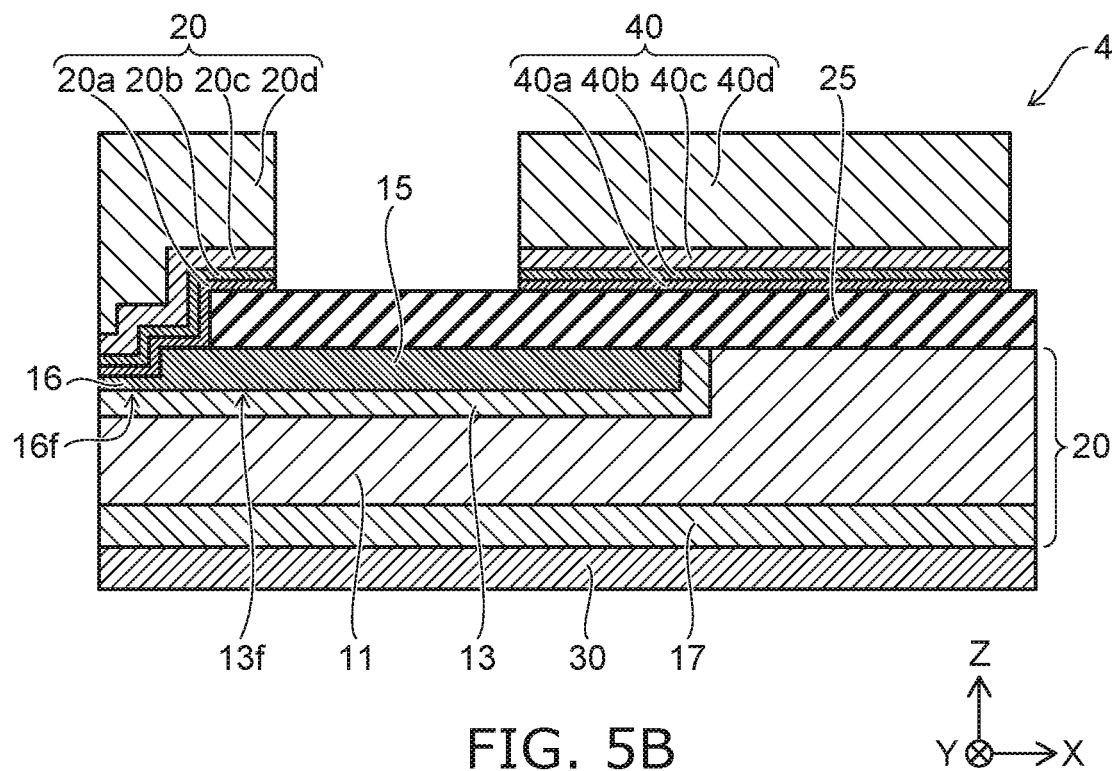

FIGS. 5A and 5B are schematic cross-sectional views showing semiconductor devices 3 and 4 according to modifications of the embodiment. FIGS. 5A and 5B are schematic views showing cross-sectional structures corresponding to the cross section shown in FIG. 1.

In the semiconductor device 3 shown in FIG. 5A, the p-type high-concentration layer 15 does not include a portion positioned between the p-type base layer 13 and the source electrode 20. In other words, it is sufficient for the p-type high-concentration layer 15 to be electrically connected to the source electrode 20 via the p-type base layer 13; and the p-type high-concentration layer 15 may not directly contact the source electrode 20. In the semiconductor device 3, the p-type high-concentration layer 15 extends in the X-direction along the third portion 45c and the second portion 45b of the gate electrode 45 (referring to FIG. 3B).

In the semiconductor device 3 as well, the parasitic resistance $R_B$ of the p-type base layer 13 can be reduced by the p-type high-concentration layer 15; and the dielectric breakdown of the gate insulating film 27f in the terminal region can be avoided.

In the semiconductor device 4 shown in FIG. 5B, for example, the p-type high-concentration layer 15 is formed to have the same depth as the p-type contact layer 16 or to be deeper than the p-type contact layer 16. In other words, a boundary 13f between the p-type base layer 13 and the p-type high-concentration layer 15 is provided at a deeper level or at the same level in the Z-direction as a boundary 16f between the p-type base layer 13 and the p-type contact layer 16. The parasitic resistance $R_B$ of the p-type base layer 13 can be reduced further thereby.

As shown in FIG. 5B, the p-type high-concentration layer 15 may be formed to directly contact the source electrode 20 and may be linked to the p-type contact layer 16. The potential difference inside the p-type base layer 13 induced by the displacement current $I_{DS}$ can be reduced further thereby.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor body including a first semiconductor layer of a first conductivity type;
a first electrode provided on a front surface of the semiconductor body;
a first control electrode placed inside a first trench, the first trench being provided on the front surface side of the semiconductor body, the first control electrode being electrically insulated from the semiconductor body by a first insulating film;
a second control electrode placed inside a second trench adjacent to the first trench on the front surface side of the semiconductor body, the second control electrode being electrically insulated from the semiconductor body by a second insulating film; and
a second electrode provided on the front surface of the semiconductor body with a third insulating film interposed, the second electrode being electrically connected to the first control electrode and the second control electrode,
the second electrode being placed to be spaced from the first electrode,
the first control electrode and the second control electrode each including a first portion, a second portion, and a third portion, the first portion being positioned between the semiconductor body and the first electrode, the second portion being positioned between the semiconductor body and the second electrode, the third portion being linked to the first portion and the second portion,
the semiconductor body further including a second semiconductor layer of a second conductivity type, a third semiconductor layer of the first conductivity type, and a fourth semiconductor layer of the second conductivity type, the second to fourth semiconductor layers being provided between the first control electrode and the second control electrode,
the second semiconductor layer being provided on the first semiconductor layer and extending along the first portions, the third portions, and the second portions of the first control electrode and the second control electrode,
the third semiconductor layer being selectively provided between the second semiconductor layer and the first electrode,
the fourth semiconductor layer being provided selectively on the second semiconductor layer, the fourth semiconductor layer extending along the third portions and the second portions of the first control electrode and the second control electrode along an extension direction of the first control electrode and the second control electrode, the fourth semiconductor layer including second conductivity-type impurities with a higher concentration than a concentration of second conductivity-type impurities in the second semiconductor layer.

2. The device according to claim 1, wherein the fourth semiconductor layer including an end portion positioned between the second semiconductor layer and the second electrode.

3. The device according to claim 1, further comprising:
a first field plate provided inside the first trench, the first field plate being positioned between the first control electrode and the first semiconductor layer; and
a second field plate provided inside the second trench and positioned between the second control electrode and the first semiconductor layer.

4. The device according to claim 3, wherein
the first field plate includes a first end portion positioned outward of the first control electrode in a first direction, the first direction being the extension direction of the first control electrode and the second control electrode,
the second field plate includes a second end portion positioned outward of the second control electrode in the first direction, and
the second semiconductor layer and the fourth semiconductor layer each include a portion protruding in the first direction further than the first control electrode and the second control electrode.

5. The device according to claim 4, wherein the second semiconductor layer have an end positioned between the first end portion of the first field plate and the second end portion of the second field plate.

6. The device according to claim 1, wherein the fourth semiconductor layer is electrically connected to the first electrode via the second semiconductor layer.

7. The device according to claim 1, wherein the semiconductor body further includes a fifth semiconductor layer of the second conductivity type, the fifth semiconductor layer being selectively provided between the second semiconductor layer and the first electrode, the first electrode contacting the fifth semiconductor layer and being electrically connected to the fifth semiconductor layer.

8. The device according to claim 7, wherein the fourth semiconductor layer is electrically connected to the first electrode via the second semiconductor layer and the fifth semiconductor layer.

9. The device according to claim 7, wherein the fourth semiconductor layer having a bottom at a level same as a level of a bottom of the fifth semiconductor layer.

10. The device according to claim 1, wherein the fourth semiconductor layer includes a portion positioned between the second semiconductor layer and the first electrode, the fourth semiconductor layer being electrically connected to the first electrode.

11. The device according to claim 10, wherein the fourth semiconductor layer contacts the first electrode.

12. The device according to claim 1, wherein the second electrode includes portions extending through the third insulating film, the portions of the second electrode being electrically connected respectively to the second portion of the first control electrode and the second portion of the second control electrode.

13. The device according to claim 1, wherein
the first insulating film and the second insulating film each include a first insulating portion, a second insulating portion and a third insulating portion, the first insulating portion being positioned between the second semiconductor layer and each of the first portions of the first and second control electrodes, the first insulating portion having a first film thickness along a second direction from the first control electrode toward the second control electrode, the second insulating portion being positioned between the second semiconductor layer and each of the second portions of the first and second control electrodes, the second insulating portion having a second film thickness along the second direction, the third insulating portion being positioned between the second semiconductor layer and each of the third portions of the first and second control electrodes, the third insulating portion having a third film thickness along the second direction, and
the first film thickness, the second film thickness, and the third film thickness are the same.

14. The device according to claim 1, wherein
the first insulating film and the second insulating film each include a first insulating portion, a second insulating portion and a third insulating portion, the first insulating portion being positioned between the second semiconductor layer and each of the first portions of the first and second control electrodes, the first insulating portion having a first film thickness along a second direction from the first control electrode toward the second control electrode, the second insulating portion being positioned between the second semiconductor layer and each of the second portions of the first and second control electrodes, the second insulating portion having a second film thickness along the second direction, the third insulating portion being positioned between the second semiconductor layer and each of the third portions of the first and second control electrodes, the third insulating portion having a third film thickness along the second direction, and
the first film thickness is thinner than the second film thickness and the third film thickness.

* * * * *